United States Patent [19]
Hshieh et al.

[11] Patent Number: 5,907,776
[45] Date of Patent: May 25, 1999

[54] METHOD OF FORMING A SEMICONDUCTOR STRUCTURE HAVING REDUCED THRESHOLD VOLTAGE AND HIGH PUNCH-THROUGH TOLERANCE

[75] Inventors: Fwu-Iuan Hshieh, Saratoga; Koon Chong So, San Jose, both of Calif.

[73] Assignee: MagePower Semiconductor Corp., San Jose, Calif.

[21] Appl. No.: 08/891,546

[22] Filed: Jul. 11, 1997

[51] Int. Cl.⁶ .................................................. H01L 21/336
[52] U.S. Cl. .......................... 438/270; 438/273; 438/589
[58] Field of Search .................................. 438/268, 269, 438/270, 271, 272, 589, 273, 274; 148/DIG. 126

[56] References Cited

U.S. PATENT DOCUMENTS

| | | | |
|---|---|---|---|
| 4,742,015 | 5/1988 | Ohagen | 438/237 |
| 5,135,880 | 8/1992 | Fisher et al. | 438/268 |
| 5,248,627 | 9/1993 | Williams | 438/268 |
| 5,527,720 | 6/1996 | Goodyear et al. | 438/270 |
| 5,567,634 | 10/1996 | Hébert et al. | 438/270 |
| 5,648,288 | 7/1997 | Williams et al. | 438/217 |

*Primary Examiner*—Michael Trinh
*Attorney, Agent, or Firm*—Kam T. Tam

[57] ABSTRACT

A power MOSFET (Metal Oxide Semiconductor Field Effect Transistor) device formed on a semiconductor substrate having a body region of a first conductivity type diffused in a semiconductor substrate with an epitaxial layer of a second conductivity type. There is also a source region of a second conductivity type formed in the body region. A portion of the body region adjacent to the source region is compensated by ion implanting a material of the second conductivity type in the portion of the body region such that the impurity concentration of the body region at the portion is reduced. As a consequence, with reduced impurity charge in the body region adjacent to the source, the threshold voltage of the MOSFET device is lowered but at no comprise in punch-through tolerance because the reduction in charge is remote from the origin of the depletion layer which is located at the boundary between the body region and the epitaxial layer.

29 Claims, 6 Drawing Sheets

Fig. 1
(PRIOR ART)
Fig. 2
(PRIOR ART)
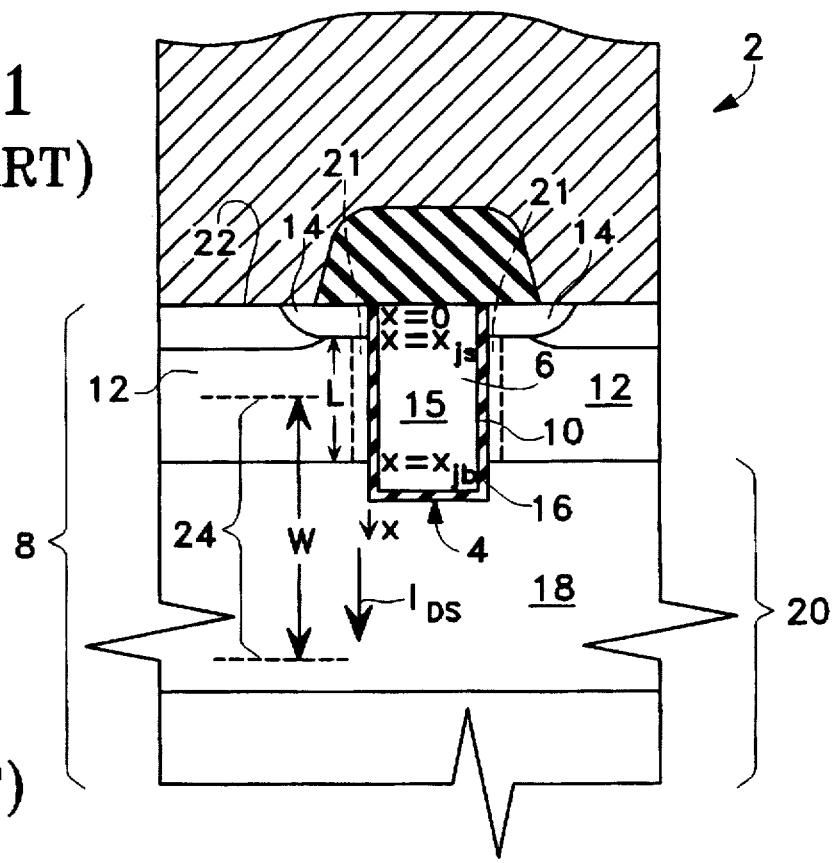
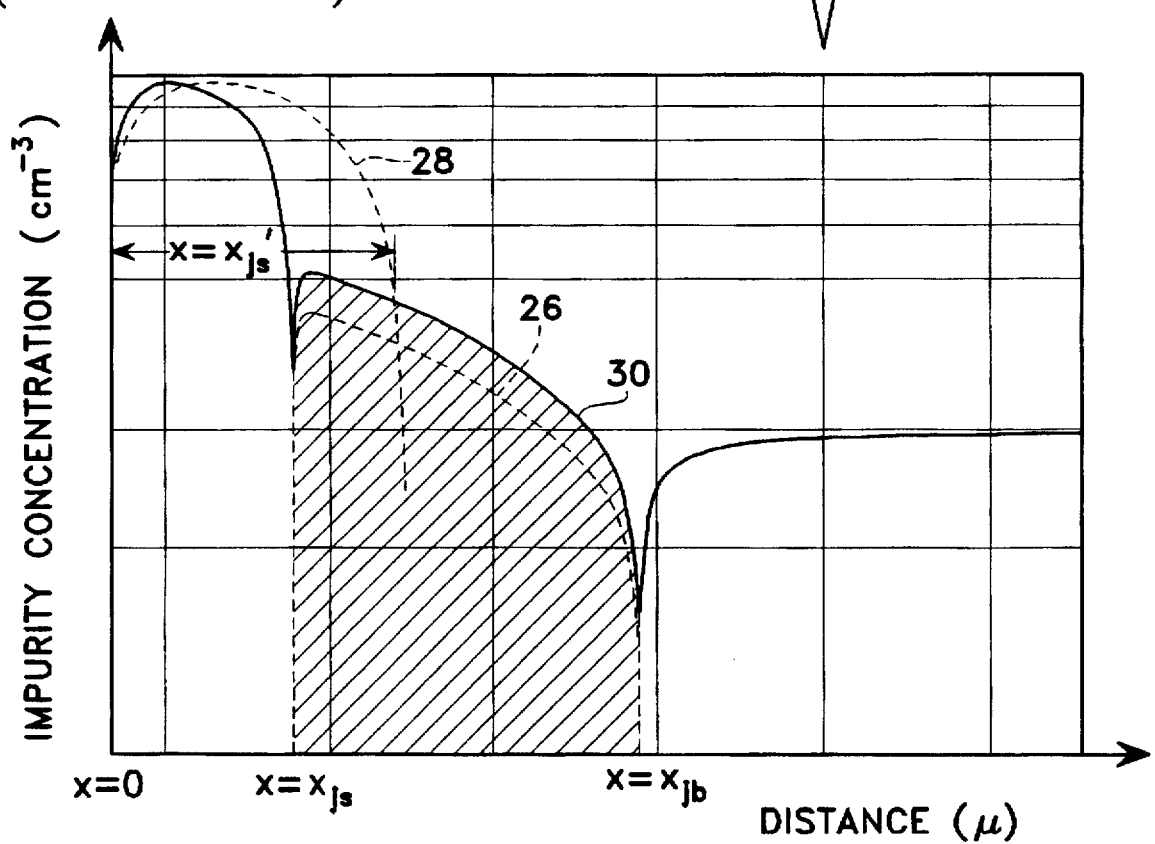

METHOD OF FORMING A SEMICONDUCTOR STRUCTURE HAVING REDUCED THRESHOLD VOLTAGE AND HIGH PUNCH-THROUGH TOLERANCE

BACKGROUND OF THE INVENTION

1. Field of the Invention

The present invention relates generally to microelectronic circuits, and more particularly, to MOSFET (Metal Oxide Semiconductor Field Effect Transistor) power devices having reduced threshold voltage and high punch-through tolerance formed by the process of impurity concentration compensation.

2. Description of the Related Art

Power semiconductor devices have long been used as replacement for mechanical relays in various applications. Modern day instruments, now built at a miniaturized scale with lower power consumption, require power devices to operate under certain stringent requirements. For instance, in a hand-held cellular telephone or a laptop computer, it is common practice to reduce the main power supply level in order to preserve battery life. Accordingly, power devices suitable to be used in these instruments must be capable of operating under reduced power levels and with low turn-on resistance.

Metal oxide semiconductor field effect transistor (MOSFET) devices using trench gates provide low turn-on resistance and are often used for low power applications. In a trench MOSFET device, the channels are arranged in a vertical manner, instead of horizontally as in most planar configurations. The consequential benefit is the realization of a higher degree of integration on a semiconductor substrate. Furthermore, since the channel directions are vertical, the lateral current paths are basically eliminated. That is, each MOSFET cell assumes its own current path and there are no more shared current paths among cells. Stated differently, the vertical arrangement of the cell channels eliminates a dominant component of the turn-on resistance $R_{ON}$, called the junction resistance $R_j$, in each MOSFET cell inherently built in a planar configuration. The junction resistance $R_j$ originates from the shared current paths among cells in a planar MOSFET device. The shared current paths essentially act as current bottle necks impeding the flow of channel current $I_{DS}$ and are key contributors to the turn-on resistance $R_{ON}$. Elimination of the junction resistance $R_j$ results in reduction in the turn on channel resistance $R_{ON}$ and consequently curtails ohmic loss during the power-on state of the MOSFET. Lower ohmic loss provides lower power consumption and further alleviates heat dissipation.

FIG. 1 shows a cross-sectional view of a conventional trenched gate MOSFET device having a cell signified by the reference numeral 2. The MOSFET cell 2 includes a trench 4 filled with conductive material 6 separated from the silicon substrate 8 with a thin layer of insulating material 10. There are also other diffusion layers of different impurity types and concentrations deposited in the semiconductor substrate 8. For examples, a source layer 14 is deposited in the body layer 12, which in turn is diffused in an expitaxial layer 18. As arranged, the conductive and insulating materials 6 and 10 in the trench 4 form the gate and gate oxide layer 16, respectively, of the MOSFET. In addition, the depth L measured from the source 14 to the epitaxial layer 18 constitutes the channel length L of the MOSFET cell 2. The epitaxial layer 18 is a part of the drain 20 of the MOSFET cell 2.

When a potential difference is applied across the source 14 and the gate 15, charges are capacitively induced in the body region adjacent to the gate oxide layer 16. The induced charges in essence is an inversion layer and is called the channel 21 of the MOSFET cell 2. When another potential difference is applied across the source 14 and the drain 20, a drain-to-source current $I_{DS}$ starts to flow from the source 14 to the drain 20 and the MOSFET 2 is said to be at the power-on state.

The conventional trenched MOSFET devices described above have an inherent high threshold voltage $V_{th}$, which is normally barely below the main power supply level required in a low power application. For example, in a low power instrument, the power supply $V_{cc}$ is commonly set at 3 Volts, while the threshold voltage $V_{th}$ of the MOSFET 2 sits at approximately 2.5 Volts. A turn-on voltage of 3 Volts applied to the gate 15 can hardly turn on the MOSFET device 2. If the power supply is from a battery source, which drops in power supply $V_{cc}$ level as time progresses, the MOSFET device 2 may never be turned on thereafter. Clearly, the conventional MOSFET 2 is not suitable to be used in applications with reduced $V_{cc}$ levels. Thus, for the power device to function properly under reduced power supply conditions, the threshold level $V_{th}$ of the MOSFET 2 has to be correspondingly reduced. Heretofore, various approaches have been attempted to reduce the threshold level of the MOSFET 2 but have not been proved successful.

Referring to FIG. 1, the threshold voltage $V_{th}$ is defined as the minimal potential difference between the gate 15 and the source 14 required to barely induce the channel 21 in the body layer 12. The threshold voltage $V_{th}$ is dependent upon a variety of factors including, inter alia, the thickness of the gate oxide 16, and the impurity concentration of the body region 12. The gate oxide thickness and the impurity concentration of the body region are more accessible parameters for adjustment, in contrast with other parameters such as the work functions or the Fermi levels of the basic materials of the MOSFET 2, which parameters require higher degree of difficulty to manipulate. A precise mathematical expression for the threshold voltage $V_{th}$ can be found in a publication by Wolf et al., "Silicon Processing for the VLSI Era", Lattice Press, IEEE Transactions on Electron Devices, Vol. 2, page 301.

Very often, the thickness of the gate oxide 16 is reduced to lower the threshold voltage $V_{th}$. However, the drawback with this approach is that making the gate oxide thickness thinner seriously undercut the final production yield and furthermore the reliability of the MOSFET. As is shown in FIG. 1, the thinner the gate oxide layer 16, the higher the probability of the conductive material 6 short-circuiting the other layers in the semiconductor substrate 8 through oxide defect in the gate oxide layer 16.

The second approach to reduce the threshold voltage $V_{th}$ is to lower the impurity concentration of the body layer 12. However, results of this approach is also fraught with various problems.

FIG. 2 shows the diffusion profile of the MOSFET cell 2. The abscissa axis of FIG. 2 represents the distance measured from the planar surface 22 toward the substrate 8 (FIG. 1). The ordinate axis of FIG. 2 corresponds to the impurity concentration of the various layers in absolute value. For example, the source layer 14 is located at a distance of $x=x_{js}$ from the planar surface 22. Similarly, the body layer 12 is positioned at a distance from $x=x_{js}$ to $x=x_{jb}$.

During normal operation, the drain 20 and the body layer 12 are reversely biased. Consequently, a depletion layer is formed characterized by a depletion region 24 with a depletion width W as shown in FIG. 1, in which the depletion layer 24 is partly shown in hidden lines. As is well known in the art, the lighter the impurity concentration of a layer, the wider is the depletion width W extending into that layer. Referring back to FIG. 1, if the body layer 12 is too lightly doped, the depletion layer 24 may encroach into the source layer 14 resulting in an undesirable effect called "punch-through". During punch-through, breakdown ensures in which drain-to-source current $I_{DS}$ flows directly from the source 14 to the drain 20 without passing through the channel 21. Specifically, as shown in FIG. 2, the hatched area underneath the impurity curve from $x=x_{js}$ to $x=x_{jb}$ corresponds to the total charge stored in the body layer 12. The threshold voltage $V_{th}$ of the MOSFET cell 2 can be lowered by reducing the impurity concentration of the body region 12, as is graphically shown by the lowered curve 26 shown in hidden line in FIG. 2. It should be noted that the ordinate axis of FIG. 2 is in logarithm scale. A slight shift in the curve 26 corresponds to a substantial change in total charge. The lowering of the impurity concentration in the body layer 12 entails the widening of the depletion layer 24 and increases the possibility of the MOSFET 2 running into punch-through as described above.

There have also been attempts to diffuse the source region 14 to a deeper depth, as shown in FIG. 2 by another hidden line curve 28 intersecting with the original body diffusion curve 30 to form a new source junction at $x=x_{js}$. The purpose is to reduce the total charge stored in the body layer 12. However, the encroachment problem of the depletion region 24 remains more or less the same because this time, the depletion layer 24 needs only to travel a shorter distance to reach punch-through.

Portable instruments and hand-held electronic products operated by batteries are now in high demand. These instruments and products are all operated by batteries with limited battery lives, at least until the next battery recharges. To preserve battery power and to ensure reliability, there has been a long-felt and increasing need to provide power devices capable of operating under reduced power levels and with low turn-on resistances, yet with robustness in punch-through tolerance.

SUMMARY OF THE INVENTION

It is accordingly the object of the invention to provide a power semiconductor device with low threshold voltage capable of operating at low power supply levels and low turn-on resistance, yet without any compromise in punch-through tolerance. The objective of providing such features in the power semiconductor device at low manufacturing cost is also sought.

The power MOSFET device of the invention is formed on a semiconductor substrate having a body region of a first conductivity type diffused in a semiconductor substrate with an epitaxial layer of a second conductivity type. There is also a source region of a second conductivity type formed in the body region. A predetermined portion of the body region adjacent to the source region is compensated in impurity concentration by ion implanting a material of the second conductivity type into the body region. As a consequence, with reduced impurity charge in the body region at the predetermined position, the threshold voltage of the MOSFET device is reduced. However, the punch-through tolerance of the MOSFET device is not affected because the reduction in charge is remote from the origin of the depletion layer which is located at the boundary between the body region and the epitaxial layer. The compensation process requires no special tooling and the increase in manufacturing costs is insignificant.

As will be explained later in this specification, a MOSFET device formed in accordance with the invention allows additional leeway to shorten the channel length, enabling the MOSFET device to be built with further lower power-on resistance. It also needs to be mentioned that with lower threshold voltage, it takes a shorter rise time to reach the lower threshold voltage level to turn on the device, thereby ensuring faster switching rate for the MOSFET cell.

These and other features and advantages of the invention will be apparent to those skilled in the art from the following detailed description, taken together with the accompanying drawings, in which like reference numerals refer to like parts.

DESCRIPTION OF THE DRAWINGS

FIG. 1, as described above, is a cross-sectional view of a conventional MOSFET device showing the various diffusion layers;

FIG. 2, as described above, is a diffusion profile of the MOSFET device of FIG. 1 illustrating the impurity concentration of the various layers;

DETAILED DESCRIPTION OF THE INVENTION

Figure 3:
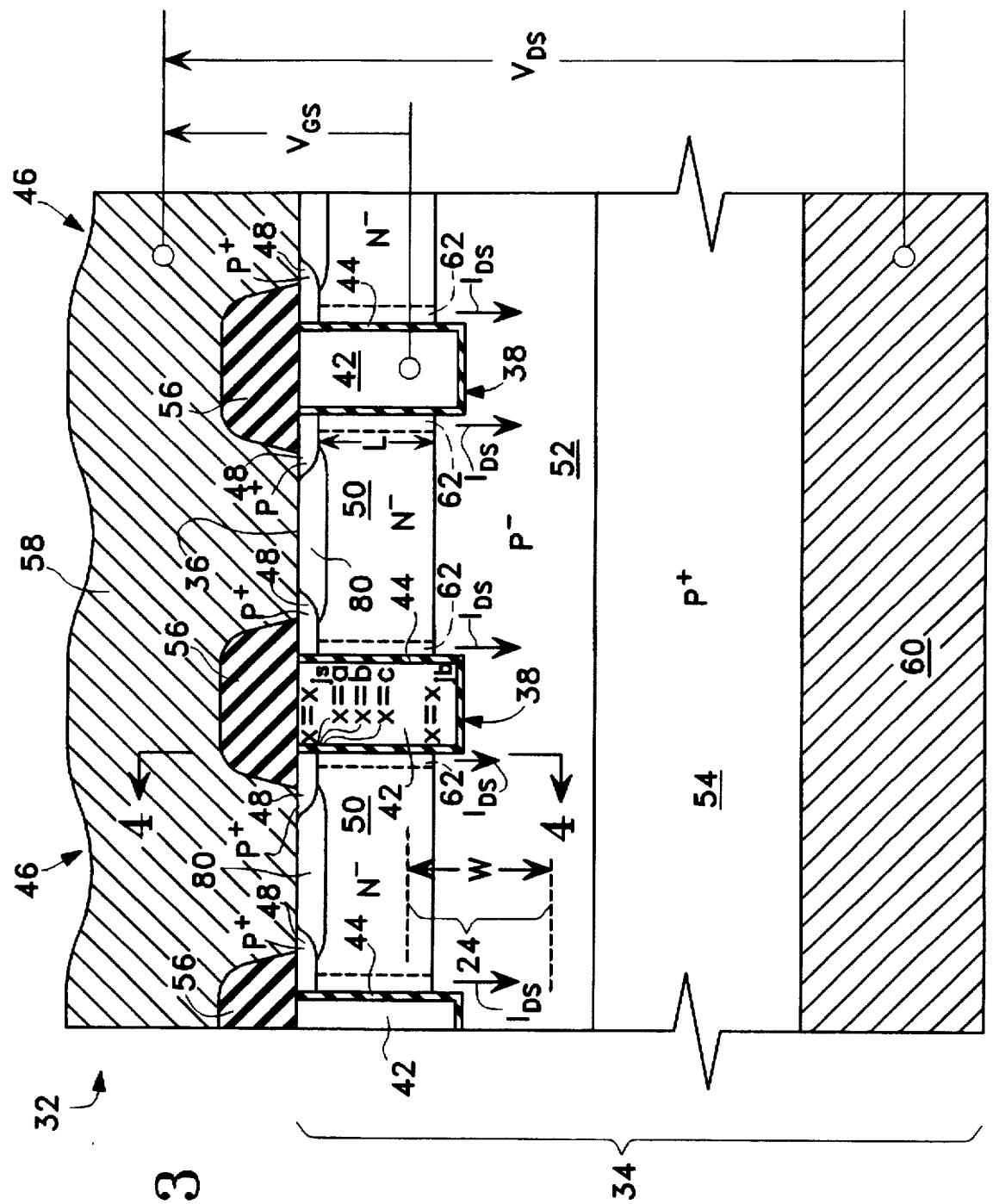
FIG. 3 is a cross-sectional view of the preferred embodiment of the invention.

Reference is now made to FIG. 3 which shows the cross-sectional view of the preferred embodiment of the invention. The semiconductor structure of the invention is generally signified by the reference numeral 32 which includes a substrate 34 having a planar surface 36. Formed in the substrate 34 is a plurality of trenches 38 filled with conductive material 42 which is electrically separated from the substrate 34 by thin insulating layers 44. In the preferred embodiment, the materials for the substrate 34, conductive material 42 and the insulating layers 44 are respectively crystalline silicon (Si), polycrystalline silicon (Si), and silicon dioxide ($SiO_2$). Each cell 46 is a P-channel MOSFET which comprises a source layer 48 made of P-type material, a body layer 50 formed of N-type material, an epitaxial layer 52 made of a lightly doped P-type material, and a drain layer 54 based on a heavily doped P-type material. Atop the trenches 38 are passivation layers 56 insulating the conductive material 42 from a source contact metal layer 58. The source contact metal layer 58 is disposed in contact with the substrate 34 via contact regions 80. There is also a drain metal contact layer 60 attached to the drain 54 of the MOSFET 32. The conductive material 42 in the each trenched gate 38 is electrically connected but is not shown in FIG. 3.

When a potential difference $V_{GS}$ exceeding the threshold voltage $V_{th}$ is applied across the source layer 48 and the trenched gates 42 through the respective metal contact layer 58 and the gate contact (not shown), an N-type inversion layer 62 is capacitively induced in the P-type body layer 50. The inversion layer 62 is called the channel of the MOSFET cell 46. The highly conductive channel 62 allows a channel current $I_{DS}$ to flow from the source 48 to the drain 54 when another potential difference $V_{DS}$ is applied across the source 48 and the drain 54 through the respective metal contact layers 58 and 60.

It should be noted that in contrast with the prior art structure 2 as described above, and shown in FIG. 1 the channel length L can be built at a shorter dimension because there is no comprise in impurity concentration in the bulk of the body region 50, as is herein explained.

Figure 4:
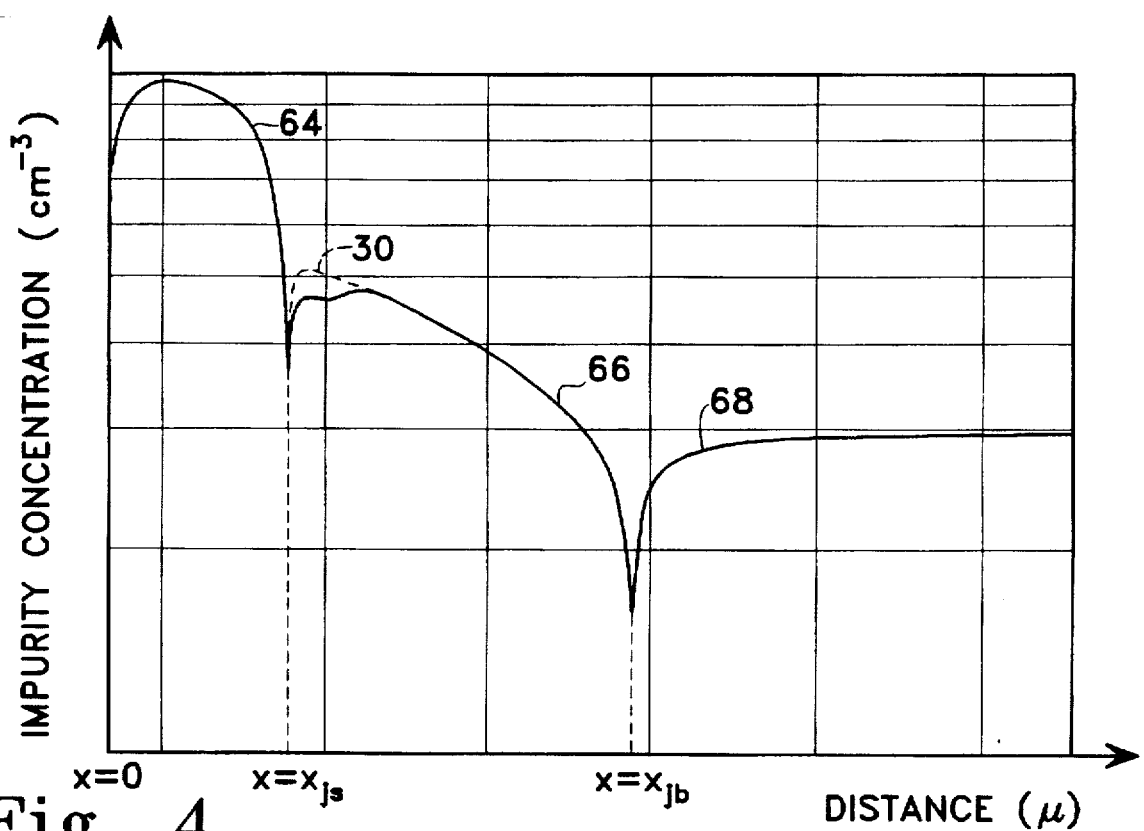
FIG. 4 is a diffusion profile of the MOSFET device of FIG. 3 illustrating the impurity concentration of the various layers.

Shown in FIG. 4 is the diffusion profile taken along the cross-sectional line 4—4 of FIG. 3. The ordinate axis of FIG. 4 corresponds to the impurity concentration of the various layers in absolute value of the semiconductor structure 32. For example, the impurity concentrations of the source region 48, the body region 50 and the expitaxial region 52 are represented by the curves 64, 66 and 68, respectively. The source layer 48 is located at a distance of $x=x_{js}$ from the planar surface 36 (x=0). Similarly, the body layer 50 is positioned at a distance from $x=x_{js}$ to $x=x_{jb}$. It should be noted that in FIG. 4, the excess impurity concentration for the body diffusion curve 66 adjacent to the source boundary $x=x_{js}$ is truncated. In contrast, the conventional body diffusion curve represented by the curve 30 shown in hidden lines in which the excess charge is clearly eminent. The leveling of the impurity profile for the body diffusion curve 66 adjacent to the source boundary $x=x_{js}$ serves important functions. First, the threshold voltage $V_{th}$ is substantially reduced because of the reduced impurity concentration near the source boundary $x=x_{js}$ in the body region 50. It should be emphasized again that even though the charge reduction shown in FIG. 4 appears to be a small proportional reduction in comparison to the total charge stored in the body region 50, nevertheless, FIG. 4 is illustrated in a logarithm scale and the reduction in impurity charge is in fact a sizable amount. Secondly, the reduction in charge is remote from the body boundary $x=x_{jb}$ where the depletion region 24 originates and extends. Since there is practically no comprise in impurity concentration in the bulk of the body region 50, the encroachment problem of the depletion layer in not much of a concern. With prudent design, the body diffusion curve 66 can be appropriately truncated such that the threshold voltage $V_{th}$ can be maintained to an acceptable level, yet at the same time, the channel length L can be shortened so as to reduce the drain-to-source resistance $R_{DS}$.

Figure 5:
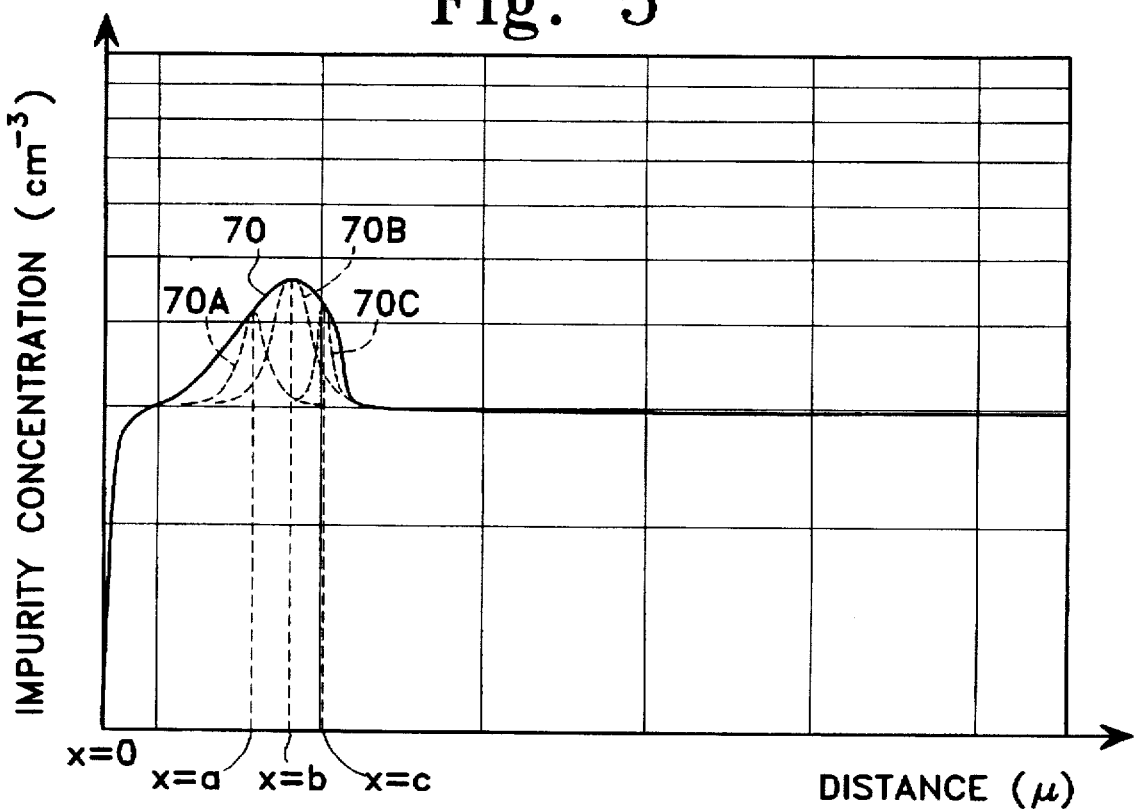
FIG. 5 is a diffusion profile highlighting only the impurity concentration of the compensation dopant impinging upon the body layer.

In the preferred embodiment, the truncated body diffusion curve 66 is accomplished by a series of implantation steps. Shown in FIG. 5 is the resultant impurity concentration profile represented by a compensation curve 70 which in essence is a superimposition of three individual implantation curves 70A–70C. The penetration distances of the individual implantation x=a, x=b, and x=c are first determined. The process of ion implantation is employed to place various dosages of dopant into the substrate 34. An exemplary technique for implanting a dopant at a predetermined penetration distance into a silicon substrate can be found in a publication by Wolf et al., "Silicon Processing for the VLSI Era", Lattice Press, IEEE Transactions on Electron Devices, Vol. 1, pages 285–291.

Figure 6:
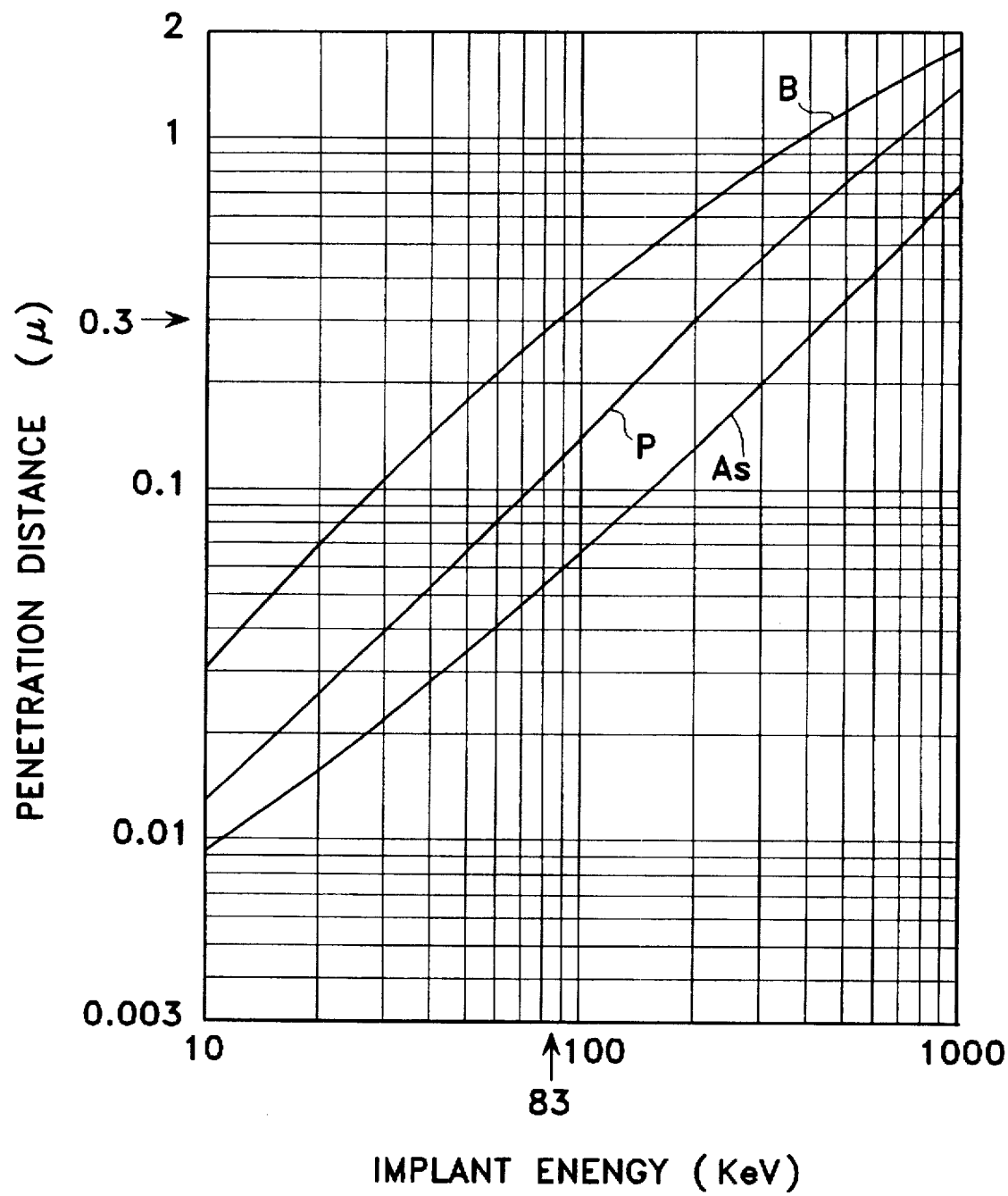
FIG. 6 is a graphical representation illustrating the relationship between the penetration distance and the required implant energy.

FIG. 6 shows a graphical representation of the relationship between the penetration distance and the required energy implantation energy level. For example, in this embodiment, boron (B) is used as the implant material. As an illustration, suppose a distance of 0.3 μ of penetration distance beyond the planar surface 36 (FIG. 3) is intended.

Once the desired penetration distance 0.3 μ is located at the ordinate axis of FIG. 6, the corresponding value on the abscissa axis can be extracted. As shown in FIG. 6, the required energy level for the implanting boron is 83 KeV. In a similar manner, positioning implant materials at other penetration distances can likewise be determined. The process of fabricating the semiconductor structure 32 with the aforementioned compensation will be described in more detail hereinafter. It should be noted that in the preferred embodiment, the compensation material is P-type material such as boron which requires less implant energy as compared to other N-type counterparts such as phosphorous or arsenic, as is shown in FIG. 6.

Figure 7A:
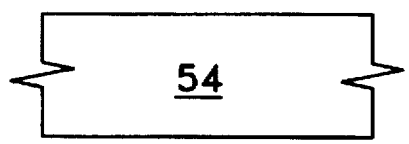
FIGS. 7A–7N are sequential views illustrating the process of making the MOSFET device of the invention.
Figure 7B:
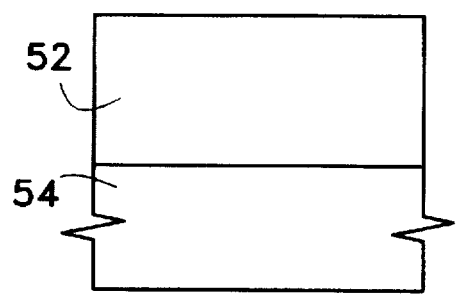

FIGS. 7A–7M are sequential views showing the process making the MOSFET device of the invention. In the preferred method, the fabrication process starts with providing a P-type base silicon wafer 54 with a <0,0,1> crystal orientation and a resistivity of between 0.01 Ω-cm=0.02 Ω-cm, for example, as shown in FIG. 7A. An epitaxial layer 52 with a resistivity of approximately between 0.1 Ω-cm= 5.0 Ω-cm is then grown atop the base wafer 52 to a thickness of approximately 3 to 20 μm. The resultant structure up to this step is shown in FIG. 7B.

Figure 7C:
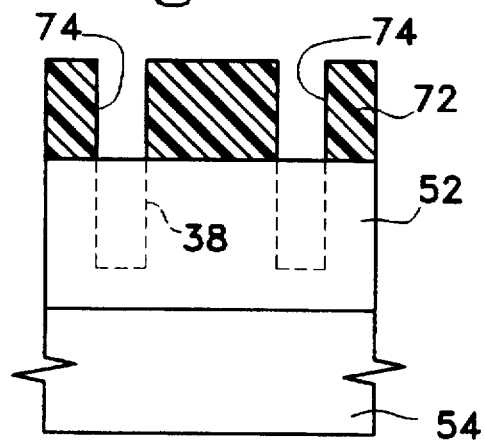

A photoresist layer 72 is then spunned atop the epitaxial layer 52. Conventional techniques of masking and etching are employed to selectively open windows 74 in the photoresist layer 72. Using the photoresist 72 as a shielding mask, the structure is then subjected to the standard technique of dry anisotropic etching by exposing the structure to a plasma (not shown) for the formation of the trenches 38 as shown in FIG. 7C.

Figure 7D:
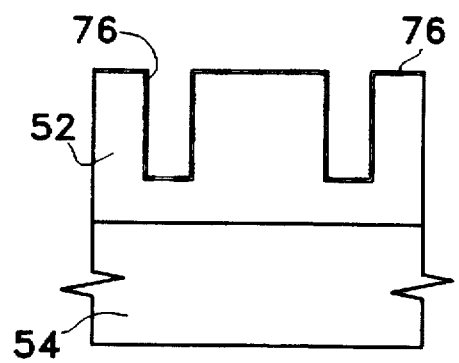

What follows is the step of forming gate oxide layers by lining the trenches 38 with insulating material. First, the trenches 38 has to undergo a sacrificial oxidation process. Basically, the structure is exposed to oxidation agent of either oxygen ($O_2$), if the dry method is employed, or steam ($H_2O$), if the wet method is preferred, under an ambient temperature of approximately between 90° C.–1,100° C. The grown sacrificial oxide layer 76 is then lightly etched away for the purpose of securing a smooth silicon surface as a prelude for subsequent gate oxide growth. The method of wet etch can be applied for the removal of the sacrificial oxide layer 76. The finished structure up to this step is shown in FIG. 7D.

Figure 7E:
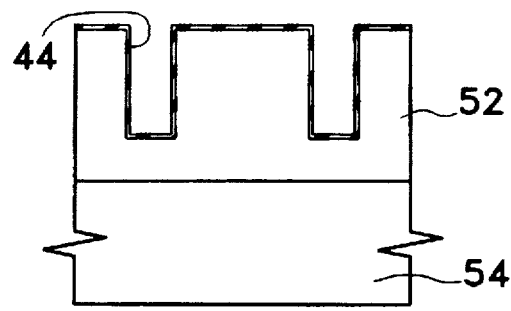

The step of gate oxide growth is then carried out by exposing the structure to either dry or wet agents as described above, under an ambient temperature of between 800° C.–1,100° C. to a thickness of approximately 200 Å–1000 Å. The finished structure with a grown gate oxide layer 44 is shown in FIG. 7E.

Figure 7F:
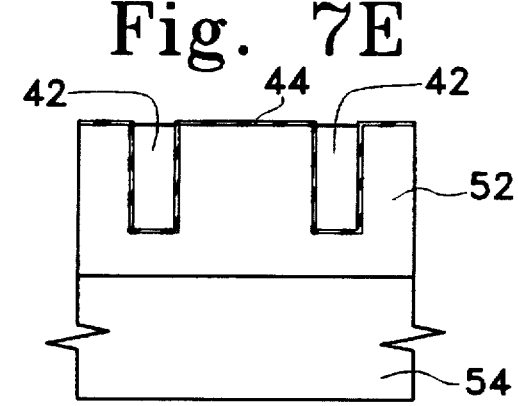

The trenches 38 need to be filled with conductive material. In the preferred method, the trenches 38 are filled with polycrystalline silicon 42 by the conventional method of chemical vapor deposition (CVD). The step of either mechanical or chemical planarization then follows. The remaining polycrystalline silicon 42 is then doped with phosphorus oxychloride ($POCl_3$) to a sheet resistivity of approximately 20–40 Ω/□ under an ambient temperature of about 950° C. The remaining polycrystalline silicon 42 is further chemically etched until the surface is barely below the oxide layer 44 as shown in FIG. 7F.

It should be noted that the polycrystalline silicon 42 is preferably doped to a N-type conductivity. As is known in the art, the charge carries for N-type material are electrons which have higher mobility than the P-type material counterparts which are holes. Thus, use of N-type polycrystalline silicon 42 can provide faster turn-on or turn-off time for the MOSFET device. The main reason stems from the reduction in the resistance component of the RC time constant, where R is the distributed resistance and C is the distributed capacitance of any signal propagation path. However, doping the polycrystalline gate to N-type in a P-channel MOSFET device always results in a high threshold voltage, as is the case with most prior art processes. The method of the present invention is especially advantageous under this situation because the threshold level can be reasonably adjusted to any level without disturbing other parameters of the device as explained previously.

Figure 7G:
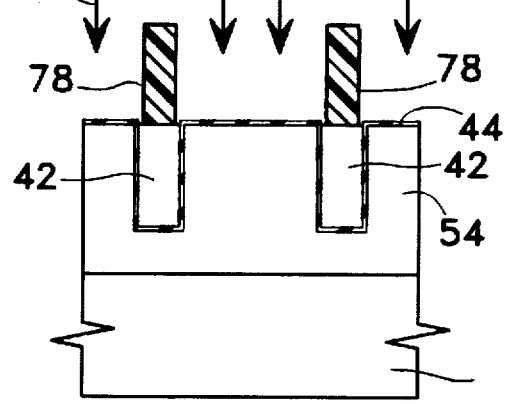
Figure 7H:
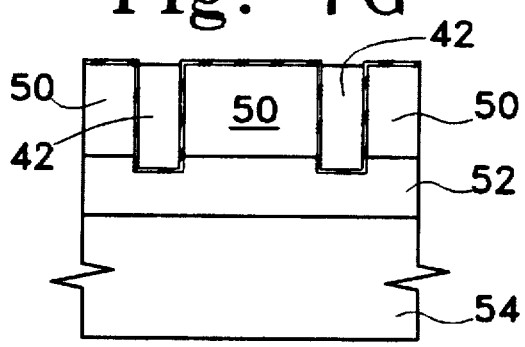

Reference is now returned back to FIG. 7G. Another photoresist mask 78 is patterned above the structure, which is then ion-implanted with phosphorous (P) under an implant potential of approximately 60 KeV–100 KeV at a dosage of about $2 \times 10^{13}$ cm$^{-2}$ to $2 \times 10^{14}$ cm$^{-2}$. It should be noted that the photoresist mask 78 is used mainly for the fabrication of the termination circuits (not shown) and its use for the processing of the MOSFET cell 46 is optional. Without the mask 78, phosphorous ions can well be implanted into the polycrystalline silicon 42 as it has already been doped heavily with the N-type dopant (POCl$_3$) as described above. The heavily doped N-type dopant overshadows the relatively lightly doped phosphorous in the polycrystalline silicon 42. The photoresist mask 78, if used as shown in FIG. 7G, is then stripped away from the structure which then undergoes a drive-in cycle at a temperature of about 1,000° C.–1,200° C., resulting in a lightly doped N-type body layer 50 driven in the epitaxial layer 52 as shown in FIG. 7H.

Figure 7I:
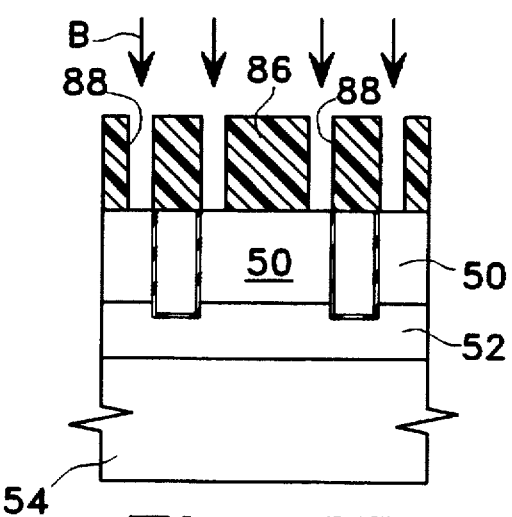

Thereafter the deposition of the source layer 48 follows. First, the remnant surface oxide is removed. Another photoresist mask 86 with source layer windows 88 is then formed on the top of the structure. Boron is then ion-implanted into the masked structure with an implant dosage of approximately $5 \times 10^{15}$ cm$^{-2}$ to $1 \times 10^{16}$ cm$^{-2}$ under an implant potential of between 40 KeV to 100 KeV, as shown in FIG. 7I.

Figure 7J:
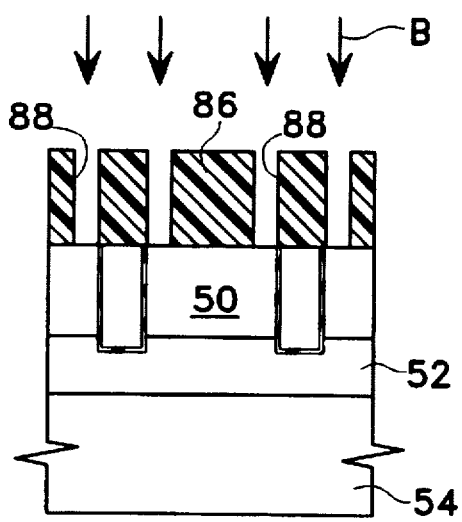

The step of body region compensation is the next step in the fabrication process. Reference is now directed back to FIGS. 3–5. To secure a reasonably level body diffusion curve 66 near the body junction $x=x_{js}$, successive implantations at various distances from the planar surface 36 (FIG. 3) are preferred. It this method, boron ions are implanted at distances of x=a, x=b and x=c from the planar surface 36 (FIG. 3), which distances correspond to the individual implant profiles 70A, 70B and 70C, respectively, as shown in FIG. 5. Profile 70B can be higher in amplitude and can be coincident with the peak value of the body diffusion curve 66 had the curve 66 not been compensated (that is, the uncompensated curve 30). Once the distances x=a, x=b and x=c are determined, the corresponding implant energy levels can be extracted from the energy chart as shown in FIG. 6. Boron is then driven into the structure as shown in FIG. 7J by the process of ion-implantation in which implant dosages are set by the implant durations.

Figure 7K:
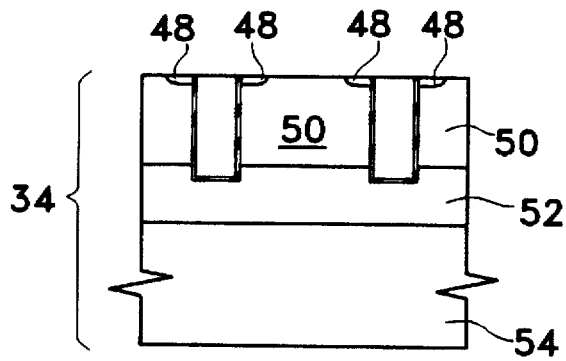

In the preferred method, the source implant and the compensation implant are subjected to a combined drive-in cycle under a temperature of between 900° C.–1,000° C. for a duration of between 10 minutes to 2 hours. The resultant structure with the deposited source layer 48 and the compensated body region 50 is shown in FIG. 7K.

After the drive-in cycle, the resultant implant profile is essentially an envelope curve 70 encompassing all the individual profiles 70A–70C. The compensation curve 70 of FIG. 5 when superimposed with the pre-compensated diffusion profile as shown in FIG. 4 results in the body diffusion curve 66 with reduced impurity concentration near the source junction $x=x_{js}$, as compared to the pre-compensated profile 30 where there is no such reduction. As mentioned before, the ordinate axis of FIG. 4 is shown in logarithm scale and the reduction in impurity concentration near the source junction $x=x_{js}$ is in fact a substantial amount. Moreover, the reduction in impurity concentration is remote from the body boundary $x=x_{jb}$ where the depletion region 24 originates and extends. Since there is no comprise in impurity concentration adjacent to the body boundary at $x=x_{jb}$, the encroachment problem of depletion layer 24 into the source region 48 would not be a concern.

Figure 7L:
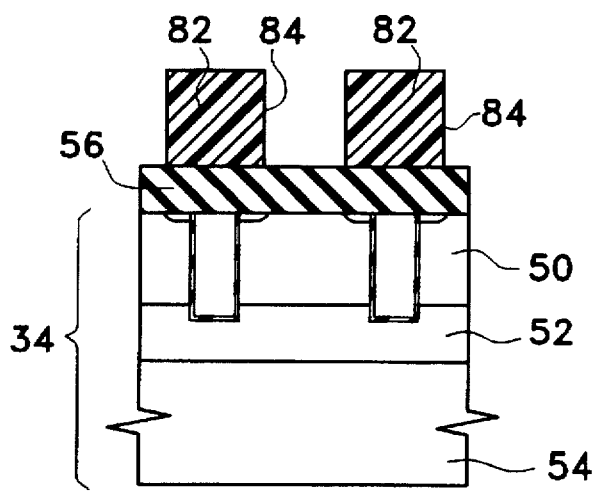

Thereafter, the deposition steps of the passivation layer 56 follows. The material for the passivation layer 56 can be phosphosilicate glass (PSG). Afterwards, another photoresist layer 82 is then formed atop the passivation layer 56. The photoresist layer 82 is then patterned with contact windows 84 as shown in FIG. 7L.

The passivation layer 56 is etched through the patterned mask 82 using an etchant which significantly attacks the passivation layer 56 but not the patterned photoresist mask 82. Either the method of dry etch or wet etch can be employed. If the dry etch method is used, the etchant is plasma. If the wet etch method is adopted, the etchant can be HF. Thereafter, the mask 82 is removed, the resultant structure up to this step is shown in FIG. 7M.

Figure 7M:
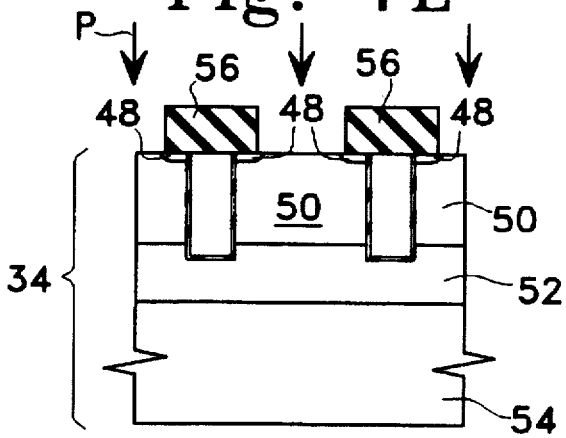

Utilizing the patterned passivation layer 56 as a mask, phosphorous ions are then implanted into the structure as shown in FIG. 7M. The implanted phosphorous is thereafter driven in the N-type body layer 50 to a slight depth. Consequently, contact regions 80 are formed in the substrate 34 as will be shown in FIG. 7N.

Figure 7N:
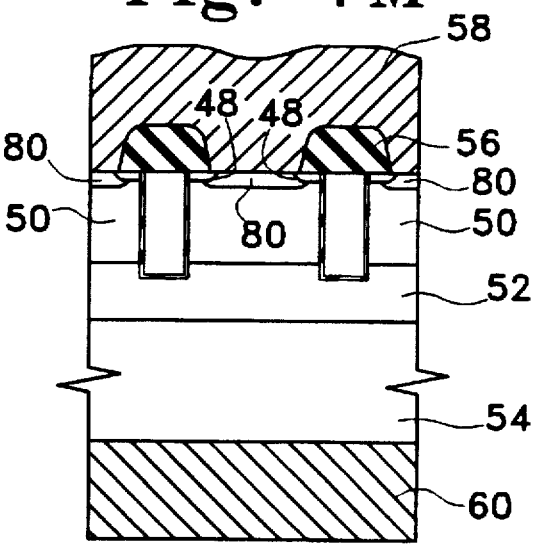

The passivation layer 56 is then subjected to a densification process under a temperature range of about 900° C.–950° C. for 30 minutes to 60 minutes. After the densification process, the corners of the passivation layer 56 are rounded off. The source and drain metal contact layers 58 and 60 can thereafter be deposited with conventional microelectronic processing techniques and are not further elaborated in here. The eventual structure up to this step is shown in FIG. 7N.

Finally, other changes are possible within the scope of the invention. The source implantation step shown in FIG. 7I and the body region compensation implantation step shown in FIG. 7J can well be reversed. That is, it is perfectly possible to perform the compensation implantation step prior to the source implantation step. Furthermore, the source implant resulted from the implantation step shown in FIG. 7I, and the compensation implant resulted from the implantation step shown in FIG. 7J can assume separated drive-in cycles. As mentioned before, the conductivity types of the layers may very well be different from that as depicted in the specification. In the preferred embodiment, the semiconductor structure is a P-channel MOSFET device. The structure can well be built as a N-channel device. Furthermore, the portion of the body region adjacent to the source need not be fully compensated with a dopant of opposite conductivity type. A partially compensated body region can well result in a MOSFET device with a reduced threshold voltage. In addition, the device fabricated in accordance with the invention need not be a power MOSFET. It can well be slightly modified and used for other purposes, such as a dynamic random access memory (DRAM) cell, an insulated gate bipolar transistor (IGBT), or a charge-coupled-device (CCD), to name just a few. It will be understood by those skilled in the art that these and other changes in form and detail may be made therein without departing from the scope and spirit of the invention.

What is claimed is:

1. A method of forming a semiconductor structure comprising the steps of:
   (a) providing a substrate having a major surface;
   (b) forming at least one trench in said substrate;
   (c) forming a body region of a first conductivity type in said substrate, said body region having a diffusion boundary in said substrate;
   (d) forming a source region of a second conductivity type in said body region; and
   (e) compensating a portion of said body region by implanting material of said second conductivity type in said body region, said portion being proximal to said source region and spaced from said diffusion boundary of said body region and said major so as to reduce the impurity concentration of said first conductivity type in said portion of said body region.

2. The method of forming a semiconductor structure as set forth in claim 1 further including filling said at least one trench with N-type material.

3. The method of forming a semiconductor structure set forth in claim 1 wherein step (a) includes providing a base substrate of said second conductivity type and forming an epitaxial layer of said second conductivity type above said base substrate.

4. The method of forming a semiconductor structure as set forth in claim 1 wherein step (c) includes the substeps of ion implanting material of said body region in said substrate and thereafter diffusing said material of said body region in said substrate.

5. The method of forming a semiconductor structure as set forth in claim 1 wherein step (d) includes the substeps of ion implanting material of said source region in said substrate and thereafter diffusing said material of said source region in said body region.

6. The method of forming a semiconductor structure as set forth in claim 5 wherein step (e) includes ion implanting material of said second conductivity type in said body region at a predetermined distance from said source region.

7. The method of forming a semiconductor structure as set forth in claim 5 wherein step (e) includes successive substeps of ion implanting material of said second conductivity type in said body region at predetermined distances from said source region.

8. The method of forming a semiconductor structure as set forth in claim 1 wherein step (e) is performed prior to step (d).

9. The method of forming a semiconductor structure as set forth in claim 1 further comprising the step of simultaneously diffusing said source region and said compensated portion of said body region after step (e).

10. The method of forming a semiconductor structure as set forth in claim 1 further comprising forming a gate region formed of material of N-type conductivity dielectrically separated from said body region.

11. The method of forming a semiconductor structure as set forth in claim 1 wherein said first conductivity type is of N-type and said second conductivity is of P-type.

12. The method of forming a semiconductor structure as set forth in claim 1 wherein the implanting material in step (e) is boron.

13. A method of forming a semiconductor structure having a trench gate with a gate threshold voltage, said method comprising the steps of:
   (a) providing a substrate having a major surface;
   (b) forming a body region of a first conductivity type in said substrate, said body region having a diffusion boundary in said substrate;
   (c) forming a source region of a second conductivity type in said body region; and
   (d) compensating a portion of said body region by implanting material of said second conductivity type in said body region adjacent to said source region and spaced from said diffusion boundary of said body region and said major surface such that the impurity concentration of said portion of said body region is substantially reduced so as to decrease the gate threshold voltage of said trench gate.

14. The method of forming a semiconductor structure as; set forth in claim 13 wherein step (d) is performed prior to step (c).

15. The method of forming a semiconductor structure as set forth in claim 13 wherein step (d) includes ion implanting material of said second conductivity type in said body region at a predetermined distance from said source region.

16. The method for forming a semiconductor structure as set forth in claim 15 wherein step (d) further including diffusing said compensated portion of said body region in said body region.

17. The method of forming a semiconductor structure as set forth in claim 13 wherein step (d) includes successive substeps of ion implanting material of said second conductivity type in said body region at predetermined distances from said source region.

18. The method of forming a semiconductor structure as; set forth in claim 17 further including the substep of filling said at least one trench with N-type material.

19. The method of forming a semiconductor structure as set forth in claim 18 wherein step (b) includes the substeps of ion implanting material of said body region in said substrate and thereafter diffusing material of said body region in said substrate.

20. The method of forming a semiconductor structure as set forth in claim 19 wherein step (c) includes the substeps of ion implanting material of said source region in said substrate and thereafter diffusing material of said source region in said body region.

21. The method of forming a semiconductor structure as set forth in claim 19 wherein step (d) includes the substep of diffusing the compensated portion of said body region in said body region and wherein the diffusing of said source region and the diffusing of said compensated portion of said body region are performed simultaneously.

22. The method of forming a semiconductor structure as set forth in claim 21 wherein step (a) includes the substeps of providing a base substrate of said second conductivity type and forming an epitaxial layer of said second conductivity type above said base substrate.

23. The method of forming a semiconductor structure as set forth in claim 22 wherein said first conductivity type is of N-type and said second conductivity is of P-type.

24. The method of forming a semiconductor structure as set forth in claim 23 wherein the implanting material in step (d) is boron.

25. A method of forming a semiconductor structure having a gate with a gate threshold voltage, said method comprising the steps of:
   (a) providing a substrate having a major surface;
   (b) forming at least one trench in said substrate extending from said major surface;

(c) forming a body region of a first conductivity type in said substrate to a diffusion boundary extending from said major surface;

(d) forming a source region of a second conductivity type in said body layer extending from said major surface; and (e) compensating a portion of said body region by implanting material of said second conductivity type in said body region adjacent to said source region and spaced from said diffusion boundary of said body layer and said major surface such that the conductivity of said portion of said body region is substantially reduced so as to decrease the gate threshold voltage of said gate.

26. The method of forming a semiconductor structure as set forth in claim 25 wherein step (b) includes the substep of lining said trenches with insulating material and followed by another substep of filing said trenches with conductive material.

27. The method of forming a semiconductor structure as set forth in claim 26 wherein said conductive material is a N-type material.

28. The method of forming a semiconductor structure as set forth in claim 25 wherein step (e) includes ion implanting material of said second conductivity type in said body region at a predetermined distance from said source region.

29. The method of forming a semiconductor structure as set forth in claim 25 wherein step (e) includes successive substeps of ion implanting material of said second conductivity type in said body region at predetermined distances from said source region.

* * * * *